United States Patent [19]

Gebara

[11] Patent Number: 5,117,331
[45] Date of Patent: May 26, 1992

[54] BUS CONTROL SIGNAL ROUTING AND TERMINATION

[75] Inventor: Ghassan R. Gebara, Houston, Tex.

[73] Assignee: Compaq Computer Corporation, Houston, Tex.

[21] Appl. No.: 701,180

[22] Filed: May 16, 1991

[51] Int. Cl.⁵ .............................................. H05K 7/06
[52] U.S. Cl. .................... 361/407; 307/542; 333/124; 361/91; 361/413
[58] Field of Search ................. 307/542, 563; 333/32, 333/100, 124, 129, 125, 130, 132; 361/88, 89, 397, 400, 407, 412, 413, 415

[56] References Cited

U.S. PATENT DOCUMENTS

| | | | |
|---|---|---|---|
| 3,832,575 | 8/1974 | Dasgupta | 307/208 |
| 4,575,780 | 3/1986 | Brombal | 361/413 |
| 4,595,923 | 7/1986 | McFarland, Jr. | 333/130 |
| 4,785,141 | 11/1988 | Nishihara | 361/406 |
| 5,012,390 | 4/1991 | Erbele | 361/413 |
| 5,057,708 | 10/1991 | Tagami | 307/303 |

Primary Examiner—Gerald P. Tolin
Attorney, Agent, or Firm—Pravel, Gambrell, Hewitt, Kimball & Krieger

[57] ABSTRACT

A bus system wherein the control signal traces on the system board are routed to eliminate noise caused by transmission line reflections. Each control signal trace is routed between the bus controller and the corresponding terminal of the first or last connector of the bus. One side of an isolation resistor whose value preferably matches the lowest impedance of a fully loaded bus is connected to the corresponding terminal of either the first or last connector in the bus connector row through a relatively short trace. The other side of the isolation resistor is connected to a trace which is routed directly to the corresponding terminal of the first of a series of system loads on the system board. The system load traces are then serially continued between each corresponding terminal of each system load until the corresponding terminal of every system load is connected. The serially routed traces are then terminated at the last system load with an RC series network forming an ac termination. This procedure is repeated for each bus control signal. Also, each of the control signals is coupled to ground through a Schottky diode having a forward bias of approximately one volt or less, in order to clamp the control signals to ground to prevent excessive undershoot.

4 Claims, 1 Drawing Sheet

BUS CONTROL SIGNAL ROUTING AND TERMINATION

BACKGROUND OF THE INVENTION

1. Field of the Invention

The present invention relates to bus control signal routing and termination in computers to improve signal integrity.

2. Description of the Related Art

A computer system uses a bus to enable its central processing unit (CPU) to communicate to various input/output (I/O) devices. The bus system may include multiple bus connectors which are usually aligned side by side forming a row of connectors. Each connector is capable of receiving compatible expansion boards which are plugged into the bus. A computer system usually includes a bus controller, or a bus driver, which interfaces the CPU to the bus and controls bus activities.

The extended industry standard architecture (EISA) is a high performance bus which extends the capabilities of the industry standard architecture (ISA) while still remaining compatible with the ISA architecture. EISA was developed to exploit the capabilities of the 80386 and 80486 microprocessors manufactured by the Intel Corporation and other high performance devices becoming available. The EISA bus system may include up to 8 bus connectors. A computer system using the EISA bus system includes an EISA bus controller (EBC), such as the 82358 EISA bus controller manufactured by the Intel Corporation, which interfaces the CPU to the EISA bus.

The bus usually includes multiple signals including address, data and control signals. Each bus connector includes a terminal for each of these signals, and these terminals are connected together through conductor wires, or traces, routed on the computer system board. The control signals are usually driven by the bus controller or by any other bus master located on an expansion board connected to the bus. Some of these control signals are edge-sensitive, wherein the important event is the rising or falling edge of the signal, rather than the signal level. Other expansion boards commonly referred to as slave boards, or bus masters operating in a slave mode, are connected to the bus and read the control signals by detecting the rising or falling edges of the signals. Significant levels of noise on these edges may lead to detection of false signals, which ultimately may interfere with the operations and reliability of the computer system.

The rising or falling edge may cause transmission line reflections on the trace for a given control signal. These reflections do not pose a significant problem if the control signal transitions are relatively slow. If the transitions are slow, the transition wave length is relatively long compared to the length of the trace, allowing the reflections to settle relatively quickly such that the resulting noise created by the reflections is insignificant. However, modern electrical components are capable of transitions of 1 to 2 nanoseconds or less, such that the signal wavelengths approach the same length as the traces on a typical computer system board. Transmission line reflections have become a significant factor as the transition times have decreased since the traces are randomly routed and are generally not properly terminated. The noise generated by the reflections causes the transition appearing on the trace to bounce one or more times before stabilizing, which may create undesirable false signal transitions.

The bus drivers, such as the EBC specifically designed for the EISA bus, are designed to drive a certain amount of load capacitance. Each expansion board adds a certain amount of load capacitance to the bus, making it more difficult for the bus driver to properly drive the control signals within a specified amount of time. The expansion board load capacitance also changes the impedance of the bus. The characteristic impedance, $Z_O$, of an unloaded bus is defined by:

$$Z_0 = \sqrt{\frac{L_0}{C_0}}$$

where $L_O$ is the intrinsic inductance of each bus trace measured in Henries/inch, and $C_O$ is the intrinsic capacitance measured in Farads/inch. $Z_O$ is measured in ohms and might range between 15 and 200 ohms. The characteristic impedance for the EISA bus is typically 50 ohms. An expansion board adds a lumped capacitance on the bus at the connector where it is plugged in. If 8 expansion boards are plugged into the bus and each connector is 0.8 inch apart, then the new impedance, $Z_O'$, of the bus is:

$$Z_0' = \sqrt{\frac{L_0}{C_0 + C_D}}$$

where $C_D$ is referred to as the distributive load capacitance per expansion board and is equal to the total capacitance of the lumped loads in Farads, divided by the length of the signal traces between the bus connector and the drivers and receivers on the expansion boards, in inches. As more expansion boards are plugged into a bus of a given length, the distributive capacitance, $C_D$, increases, which causes the impedance of the bus, $Z_O'$, to decrease. The calculation of $Z_O'$ will vary depending upon the capacitance per expansion board and the length of the traces between each board.

The EISA specification designates that the length of the signal traces between the bus connector and the drivers and receivers on expansion boards should be limited to 2.5 inches, and that the maximum allowable loading capacitance per expansion board should be 20 pF, including wiring capacitance and the total load capacitance. Even if every expansion board manufacturer followed the specification, a system with 8 expansion boards plugged into the EISA bus may cause the bus impedance to drop to 15 ohms or less. The primary significance of the decrease in the bus impedance is that it causes an impedance mismatch between the bus driver, such as the EBC, and the bus, as well as changes along the bus transmission line such that the impedance is not uniform along the bus transmission line. The result of this impedance mismatch is an increase in the amount of transmission line reflections appearing on the bus.

In addition to the various boards which can be added via the bus connectors, various components located on the system board, referred to as system loads, are connected to the bus and the bus driver, adding capacitance and loading. The system board loads generally do not add as much load as a fully loaded bus. For example, if the system loads were wired together with traces on the mother board, the total impedance of the system load traces as loaded by the system loads would not match the impedance of the bus. When the system load traces are connected to the bus traces, an impedance mismatch occurs such that reflections from the system loads interfere with and create undesirable noise on the bus.

Prior to the present invention, the signal board traces were generally randomly routed by an auto-router having little or no routing specifications. The primary goal was to connect each node efficiently with as short a trace as possible, with little concern for the resulting trace pattern. Occasionally, overrides were specified for particularly sensitive components, such as clock oscillation circuits, but the random routing was utilized in most other portions. This random routing method led to an array of disordered traces with multiple transmission lines on each node.

In an EISA bus system, for example, a trace might have been routed from the EBC to a system load, and then fanned out from that load to every other system load including the EISA bus itself. Each fanned out trace forms a transmission line without proper termination, causing multiple reflections for each signal transition. In that case, the impedance mismatch between the system loads and the EISA bus would cause reflections generated by the system loads to further interfere with the signals on the bus. Alternatively, a trace might have included one or more T connections, wherein each T connection formed multiple transmission lines between the system loads, causing the same problem. The combination of random node connections and a significant amount of load on the bus caused a substantial and undesirable level of transmission line reflections, which further caused the slave expansion boards to detect at least one false transition. These false transitions severely compromised system operations and reliability, eventually resulting in system failure.

In addition, certain components that can be used on expansion boards to be plugged into the bus are sensitive to significant control signal undershoot. Undershoot occurs when a bus driver sinks enough current during a high to low transition to pull the signal voltage below electrical ground. When the undershoot causes the voltage signal to fall 2 volts or more below ground, sensitive components are damaged, especially if significant undershoot occurs frequently.

SUMMARY OF THE PRESENT INVENTION

The present invention provides a bus system wherein the control signal traces on the system board are routed to suppress transmission line reflections. The present invention further provides circuitry to eliminate significant undershoot of the control signals. The preferred embodiment is in a computer system using an EISA bus and an EBC. Each EISA control signal trace is routed directly from the EBC terminal to the corresponding terminal of either the first or the last connector of the row of EISA bus connectors on the system board. These traces, along with each corresponding trace connecting the corresponding terminals of each EISA bus connector, forms a single EISA bus transmission line for each EISA bus control signal. In this manner, by routing to the first or last connector in the row of connectors rather than to an intermediate connector, any reflections caused by a T connection on the bus are eliminated.

The corresponding terminal of each EISA control signal of interest of the first or last EISA connector is connected to one side of an isolation resistor through a relatively short trace, the resistor having a resistance which approximately matches the worst case, or lowest impedance, of a fully loaded EISA bus. In this manner, there is one isolation resistor for each EISA control signal of interest. The other side of the isolation resistor is connected to a trace which continues directly to the corresponding terminal of a first, usually the closest, system load. Each trace is continued serially to each system load, one at a time, until each corresponding terminal of every system load is serially connected. Each serial trace is then terminated with an ac termination at the terminal of the last system load. Each ac termination comprises a resistor and a capacitor coupled in series between each EISA control signal terminal of the last system load and ground.

The traces between the EBC bus drivers and the corresponding terminals of the first or last EISA bus connector, combined with the traces connecting the corresponding terminals of the EISA connectors, forms a single EISA bus transmission line for each EISA control signal. The traces serially connecting the system loads form a separate system load transmission line for each EISA control signal which is terminated by an ac termination. The isolation resistors couple each EISA transmission line to its corresponding system load transmission line while at the same time isolating reflections between the two. The isolation resistors primarily act to dampen reflections from the system loads to the EISA transmission line. Furthermore, by matching the impedance of the EISA bus, the isolation resistors tend to dampen and suppress transmission line reflections on the EISA bus.

Additionally, each of the EISA control signals on the EISA bus is coupled to ground through a Schottky diode having a forward bias voltage of approximately 1 volt. Each Schottky diode operates as a voltage clamp in that if a driver attempts to pull the voltage on that control signal below −1 volt, the Schottky diode conducts to prevent an undershoot of more than 1 volt below ground.

BRIEF DESCRIPTION OF THE DRAWING

A better understanding of the invention can be obtained when the following detailed description of the preferred embodiment is considered in conjunction with the following drawing, in which.

DETAILED DESCRIPTION OF THE PREFERRED EMBODIMENT

Figure 1:
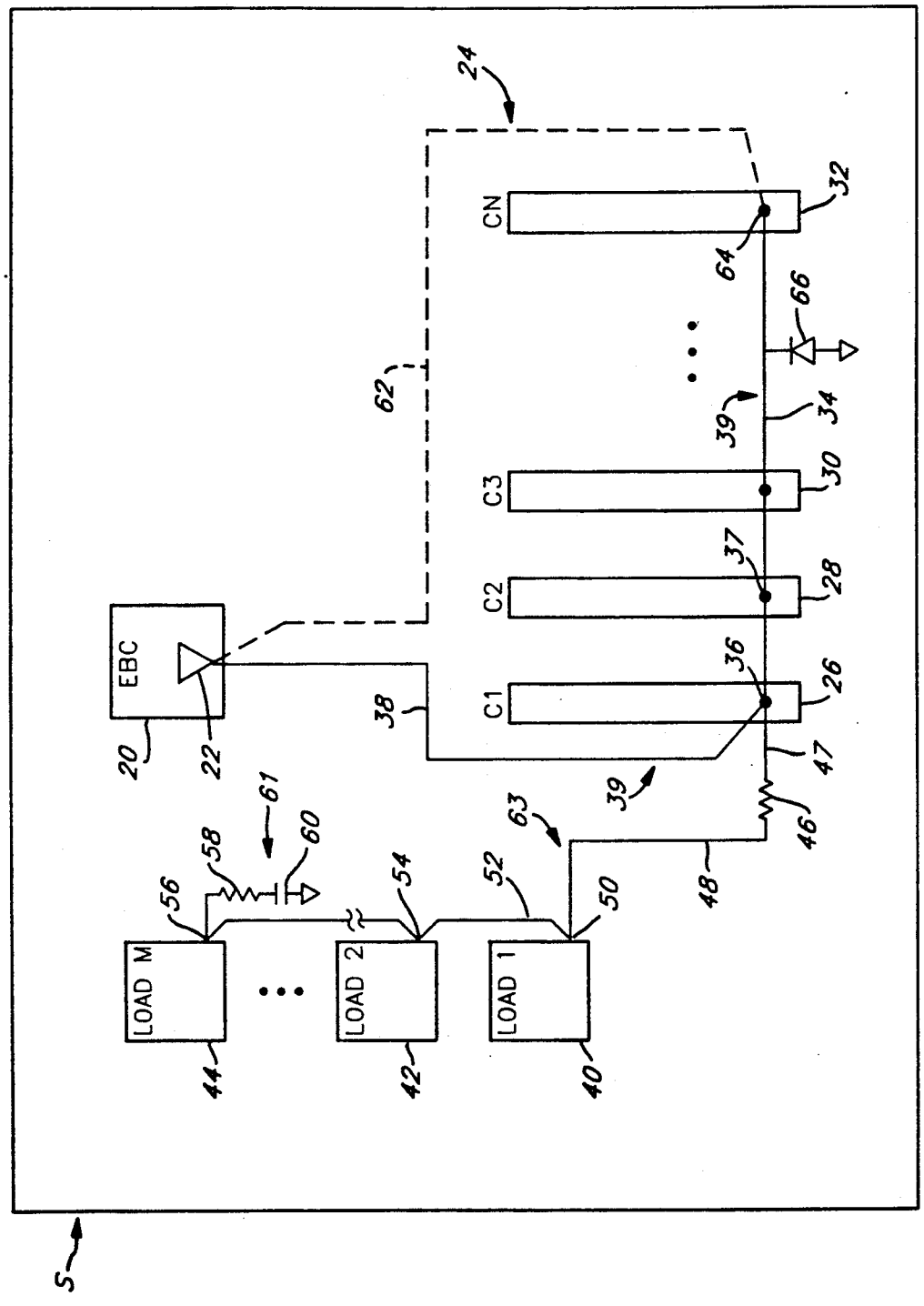
FIG. 1 is a partial block diagram of a computer system board using the bus apparatus of the present invention.

Referring to the drawing, FIG. 1 illustrates a partial block diagram of a computer system board, generally referred to by the letter S, including the bus system of the present invention. An EISA bus controller (EBC) 20, such as the 82358 EISA bus controller manufactured by Intel Corporation, interfaces the CPU and other portions of the computer (not shown) to an EISA bus 24. The portions of the computer system not shown are conventional and have been omitted for clarity, one skilled in the art understanding the various computer system designs that can be utilized with the EBC 20 and the EISA bus 24. The EBC 20 includes a series of buffers, such as the buffer 22, which drive signals of the EISA bus 24. The EISA bus 24 may include up to 8 bus connectors, usually aligned side-by-side forming a row of EISA connectors 26, 28, 30 and 32, where connector 26 is the first EISA bus connector, and connector 32 is the last for purposes of this description. Each of the connectors 26-32 is capable of receiving an EISA or ISA compatible expansion board (not shown) which is plugged into any one of the connectors 26-32 so that the expansion board can communicate with various devices on the computer system. FIG. 1 illustrates only the four connectors 26-32, although several more connectors might be included between the connectors 30 and 32. Logically, there can be up to 15 connectors, although due to electrical limitations, most computer systems include only up to 8.

Each connector 26-32 comprises a series of terminals (not shown), such as the terminal 36 of the connector 26, wherein each terminal corresponds to one of the EISA bus signals. The preferred embodiment directly concerns the EISA-specific (as opposed to ISA) control signals which are edge-sensitive, but the present invention can be utilized by other signals present in other bus designs. FIG. 1 illustrates the preferred embodiment of the present invention as applied to only one of the EISA control signals, but it is understood that the same configuration applies to each EISA control signal. A trace 34 is routed from a terminal 36 of the first EISA bus connector 26 to each corresponding terminal on the connectors 28-32, including the corresponding terminal 64 of the last connector 32. Again, a series of separate traces, each similar to the trace 34, connects together each corresponding terminal of each connector 26-32 of the EISA bus 24. A bus driver 22, associated with a particular control is located in the EBC 20 and is connected to the corresponding terminal 36 of the bus connector 26 by a trace 38. Each of the drivers of the EBC 20, such as the driver 22, is connected to the corresponding terminal of the first connector 26, by a trace similar to the trace 38. In the 82358, the preferred EBC, each control signal output driver is specified to drive a 120 pF load and to cooperate with a load impedance of approximately 50 ohms.

The traces 38 and 34 together act as a single EISA bus transmission line 39 as seen by the bus driver 22 of the EBC 20. Therefore, there is a single EISA transmission line, such as the EISA transmission line 39, for each EISA control signal between each driver of the control signal in EBC 20 and the terminal 64 of the last connector 32. Prior art connection apparatus might form a T connection, wherein the bus driver 22 would be connected with a trace directly to a corresponding terminal 37 of the connector 28, forming three transmission line traces: the first between the bus driver 22 and the terminal 37, the second between the terminals 36 and 37, and the third between the terminals 37 and 64. This prior art connection scheme would result in undesirable reflections on the EISA control signal driven by the bus driver 22.

Alternatively, if the EBC 20 is physically closer to the last connector 32 of the EISA bus 24, then an alternative trace 62 could be used to connect the bus driver 22 to the corresponding terminal 64 of the last connector 32, instead of the trace 38. The single transmission line formed by the traces 62 and 34 would act substantially similar to the single transmission line 39.

The system board S may include multiple system loads, such as the system loads 40, 42 and 44 shown in FIG. 1, that are used by the computer system to access the EISA bus 24. More loads might be included between the system loads 42 and 44 depending upon the computer system. Of course, the computer system might also include less system loads. One side of an isolation resistor 46 is connected to the terminal 36 of the connector 26 either directly or through a very short trace 47. The isolation resistor 46 should preferably be physically located as close as possible to the connector 26, to keep the trace 47 as short as possible to avoid creating another transmission line. The value of the isolation resistor 46 should preferably match the impedance of the worst-case, or fully loaded EISA bus 24. In an 8 connector system on a 50 ohm trace circuit board the preferred value of the isolation resistor 46 is approximately 20 ohms. A standard 22 ohm resistor will suffice. The other side of the isolation resistor 46 is connected to a corresponding terminal 50 of the first system load 40 by a trace 48. Another trace 52 is routed to connect the terminal 50 of the first load 40 to a corresponding terminal 54 of the second load 42. This serial connection scheme is continued, connecting each system load one at a time, until a corresponding terminal 56 of the last system load 44 is connected to the corresponding terminal of every system load. It is noted that the traces 48 and 50 and the other serial traces do not contain T connections or branches, but are a single, continuous, nonbranching trace.

One side of a resistor 58 is connected to the terminal 56 of the last load 44, and the other side of the resistor 58 is connected to one side of a capacitor 60. The other side of the capacitor 60 is connected to electrical ground. The resistor 58 and the capacitor 60 form an ac termination 61. It is understood that the above procedure should be repeated until each of the terminals of the connector 26 of concern is coupled through isolation resistors, each having the same resistance as the isolation resistor 46, to the corresponding terminals of each of the system loads, such as the system loads 40-44.

The set of traces, including the traces 48, 52 and all other traces that connect the corresponding terminals 50, 54 and 56 of the system loads 40, 42 and 44, comprise a system load transmission line 63 which is terminated by the ac termination 61 comprised of the resistor 58 and the capacitor 60. The ac termination 61 should have an impedance which is approximately equivalent to the impedance of the system load transmission line 63 as loaded by the system loads 40-44. The capacitor 60 eliminates the DC component which could otherwise damage the system loads 40-44. The isolation resistor, such as the isolation resistor 46, isolates the system load transmission line, such as the system load transmission line 63, from the EISA bus transmission line, such as the transmission line 39. In this manner, the isolation resistor 46 serves to dampen reflections created by the system loads 40-44 travelling on the system load transmission line 63 towards the EISA bus transmission line 39. Also, the isolation resistor 46 serves to absorb reflections from the EISA bus 24, acting as a series terminator for the EISA bus 24.

It is also to be understood that the system load 40 does not have to be the first connected load. A trace (not shown) could be connected between the isolation resistor 46 and the terminal 54 of the system load 42, and then another trace between the terminal 54 and the terminal 56 of the system load 44, and so on, until all system loads are serially connected. The system loads 40-44 may be connected in any order as long as they are serially connected one at a time, with the ac termination 61 connected at the terminal of the last system load as described previously. It is preferable, however, to connect the system loads 40-44 in the order of physical proximity to keep the traces as short as possible. Also, if the first closest load, such as the system load 40, is closest to the last EISA bus connector 32, the system loads 40-44 could be coupled through isolation resistors to the last connector 32 instead of the first connector 26. For example, the isolation resistor 46 could be connected between the terminal 64 and a trace (not shown) routed to the terminal 50. This is independent of whether the trace 38 or the trace 62 is used since the isolation resistor 46 isolates the EISA bus transmission line 39 from the system load transmission line 63.

The bus driver 22, or a bus driver located on an expansion board plugged into one of the connectors 26-32 which is equivalent to the bus driver 22 for purposes of this description, particularly a bus mastering board, may sink a substantial amount of current during a high-to-low transition. This may cause the control signal voltage to drop below electrical ground by as much as 2 volts or more. This significant control signal undershoot could potentially damage sensitive components on expansion boards which are plugged into any of the connectors 26-32. Also, significant undershoot adds undesirable noise on the EISA bus 24. A Schottky diode 66, such as the HSMS 2800 Schottky diode manufactured by the Hewlett Packard Corporation, the SN74S1056 Schottky diode manufactured by Texas Instruments, or the like, has its anode connected to ground and its cathode connected to the signal trace 34. The Schottky diode 66 preferably has a forward bias voltage of approximately one volt or less and serves to clamp each of the EISA bus 24 control signals to ground. A Schottky diode, each similar to the Schottky diode 66, is connected to each of the traces of concern, such as the trace 34, in a similar manner until all of the EISA control signals of interest are coupled to ground through Schottky diodes.

The Schottky diode 66 prevents the bus driver 22, or any other bus driver connected to the EISA bus 24, from pulling the control signal below ground by more than 1 volt by turning on and clamping the signal to ground. The Schottky diode 66 will, therefore, prevent a signal undershoot of more than one volt below ground, thereby protecting the sensitive components located on expansion boards plugged into the connectors 26-32 of the EISA bus 24, and preventing additional noise on the EISA bus 24.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

I claim:
1. A computer bus system, comprising:
   a system board for mounting electrical components;
   an electrical component mounted on said system board having a terminal for generating electrical signals;
   a plurality of connectors mounted serially on said system board for receiving circuit boards, each said connector each having at least one terminal;
   at least one electrical conductor, each said conductor serially routed and connected to a corresponding terminal of each of said plurality of connectors;
   at least one system load mounted on said system board, each said system load having a terminal for receiving an electrical signal;
   an electrical conductor connected to said electrical signal generating terminal, said conductor routed and connected to a corresponding terminal of one end connector of said multiple connectors without branching prior to connection to said end connector terminal;
   a resistor;
   a relatively short electrical conductor connected to one end of said resistor, said conductor routed and connected to one of said terminals of an end connector of said plurality of connectors;
   an electrical conductor connected to the other end of said resistor, said conductor serially routed and connected to a corresponding terminal of each said system load without branching, wherein said conductor ends at one of said at least one system load; and
   ac termination means connected to said corresponding terminal of said at least one system load wherein said conductor end.

2. The system of claim 1, wherein said ac termination means comprises a resistor and a capacitor electrically connected in series between said last system load terminal and ground.

3. The system of claim 1, further comprising:
   a diode having its anode connected to ground and its cathode connected to one of said electrical conductors serially routed and connected to said terminals of said multiple connectors.

4. The system of claim 3, wherein said diode is a Schottky diode.

* * * * *

UNITED STATES PATENT AND TRADEMARK OFFICE
CERTIFICATE OF CORRECTION

PATENT NO. : 5,117,331

DATED : MAY 26, 1992

INVENTOR(S) : GHASSAN R. GEBARA

It is certified that error appears in the above-identified patent and that said Letters Patent is hereby corrected as shown below:

Col. 8, line 39, change "end" to "ends".

Signed and Sealed this

Twenty-first Day of September, 1993

Attest:

BRUCE LEHMAN

Attesting Officer  Commissioner of Patents and Trademarks